(12) United States Patent
Aki (10) Patent No.: US 7,235,804 B2
(45) Date of Patent: Jun. 26, 2007

(54) METHOD FOR MANUFACTURING OPTOCOUPLER

(75) Inventor: Motonari Aki, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 11/400,220

(22) Filed: Apr. 10, 2006

(65) Prior Publication Data

US 2006/0284124 A1 Dec. 21, 2006

(30) Foreign Application Priority Data

Jun. 16, 2005 (JP) ............................. 2005-176567

(51) Int. Cl.
*G02B 27/00* (2006.01)
(52) U.S. Cl. ..................... 250/551; 257/80; 438/24
(58) Field of Classification Search ................ 250/551, 250/239, 214.1; 257/80–85; 438/24, 25
See application file for complete search history.

(56) References Cited

U.S. PATENT DOCUMENTS 3,914,137 A 10/1975 Huffman et al.

6,759,667 B2 * 7/2004 Yasuda ....................... 250/551
2005/0218300 A1 * 10/2005 Quinones et al. ......... 250/214 R

FOREIGN PATENT DOCUMENTS

| JP | 48-46278 | 7/1973 |
| JP | 6-5906 A | 1/1994 |
| JP | 7-312443 A | 11/1995 |

* cited by examiner

*Primary Examiner*—Kevin Pyo
(74) *Attorney, Agent, or Firm*—Birch, Stewart, Kolasch & Birch, LLP (57) ABSTRACT

A multichannel monolithic chip that has a number of photo-couplers provided on a single silicon substrate is mounted on an insulating substrate, a first cut groove is formed by dicing between a light-emitting element and a light-receiving element that constitute a photo-coupler, a transparent insulating resin is filled into the first cut groove and then a second cut groove is formed by dicing between the adjacent photo-couplers, each of the light-emitting element and the light-receiving element is electrically connected to an external terminal using a bonding wire, and the entirety of the insulating substrate is molded with a light-blocking resin.

12 Claims, 9 Drawing Sheets

METHOD FOR MANUFACTURING OPTOCOUPLER

BACKGROUND OF THE INVENTION

This application claims priority under 35 U.S.C. § 119(a) on Patent Application No. 2005-176567 filed in Japan on Jun. 16, 2005, the entire contents of which are hereby incorporated by reference.

The present invention relates to a multichannel optocoupler having a plurality of photo-couplers including a pair of a light-emitting element and a light-receiving element.

Typically, examples of the main applications of photo-couplers include their use as a "switching power supply" and a "communication interface of a factory automation (hereinafter referred to as "FA") device".

In the case of switching power supply circuits, the photo-coupler used as an electrical insulation between the primary and the secondary side is the third largest component next to the transformer and the capacitor, so that its mounting area and height tend to be large.

Because of the advent of high-frequency insulated gate bipolar transistor (hereinafter referred to as "IGBT") elements and others in recent years, the component size of capacitor and transformer has been continuously reduced, and it is expected that there will be a demand for the size reduction of switching power supply circuits.

Also, in high-speed communication photo-couplers that are used for the communication interface of an FA device, the number of nodes per mounting substrate is large, so that there is a demand for the accommodation for a large number of channels within a limited mounting area.

In addition, in order to stabilize high-speed communication, accuracy in response delay time as well as in PWD (pulse width distortion) must be improved. To achieve this, the mounting process requires highly accurate and reliable relative positioning of the light-emitting element and the light-receiving element, which are insulated and separated in a photo-coupler.

Furthermore, in achieving this, it is desirable that mounting of a highly populated package be as simple and easy as possible.

Known photo-couplers include photo-couplers in which GaAs and Si are integrated on a single chip (for example, see S48-46278A) and photo-couplers in which an insulating portion is formed by photo-lithography method and etching using a GaAlAs substrate (for example, see H6-5906A).

A device with a multichannel version of this photo-coupler has also been contemplated (for example, see H7-312443A). The semiconductor device that is described in the above-mentioned H7-312443A uses an insulating optical waveguide that is based on $TiO_2$, and has a very complicated structure in terms of processing.

In the conventional example that is described in the above-mentioned H7-312443A, a structure for preventing crosstalk between adjacent photo-couplers (channels) is formed through a complicated and troublesome semiconductor process, and this contributes to a steep rise in production cost.

On one hand, the higher the accuracy of the relative positional relationship between the light-emitting element and the light-receiving element, which constitute the photo-coupler, is, the more stable electrical properties are achieved. On the other hand, if crosstalk between adjacent channels can be adequately limited, such high accuracy in the relative positional relationship of the pair of light-emitting element and light-receiving element as described above is not necessary. For this reason, the inventor of the present invention considered the use of such a semiconductor process as described in the above-mentioned conventional example unnecessary, and arrived at the present invention.

SUMMARY OF THE INVENTION

It is an object of the present invention to provide a structure that can adequately inhibit crosstalk between adjacent channels in a simple manner and at a low cost in a method for manufacturing a multichannel optocoupler.

In one aspect of the present invention, a method for manufacturing an optocoupler having a plurality of photo-couplers each of which comprises a pair of a light-emitting element and a light-receiving element, includes: a step of mounting a multichannel monolithic chip, which has a plurality of the photo-couplers formed on a single semiconductor substrate, on an insulating substrate, a step of insulating and separating the light-emitting elements and the light-receiving elements by dicing a first cut groove between the light-emitting elements and the light-receiving elements, which constitute the photo-couplers in the chip on the insulating substrate, a step of filling a transparent insulating resin into the first cut groove, a step of dividing the individual photo-couplers by dicing a second cut groove between the adjacent photo-couplers, and a step of connecting each of the light-emitting elements and each of the light-receiving elements to an external terminal using a bonding wire and molding the entirety of the insulating substrate with a light-blocking resin.

In this case, since a mechanical process such as dicing is used, the number of steps can be reduced and the needs for micromachining can be eliminated compared to when photo-lithography or etching as in the conventional example is used. This simplifies the operations and improves the operating efficiency, and can thus drastically reduce the production cost.

In the above described method for manufacturing an optocoupler, the depth of the second cut groove may be set to a depth that does not reach the bottom surface of the chip.

In this case, the potential of an emitter or a ground can be shared between multichannel light-receiving elements.

In the above described method for manufacturing an optocoupler, the depth of the second cut groove may be set to a depth that reaches into the insulating substrate.

In this case, crosstalk between adjacent channels can be inhibited more effectively.

In addition, a conductor that includes a transparent conductive material that has been grounded may be provided on a light-receiving surface of the light-receiving element.

In this case, since the electric charge that is generated by a sudden potential change between the light-emitting elements and the light-receiving elements can escape to the outside without going through the light-receiving elements, superior noise tolerance can be achieved, in other words, the CMR property of the photo-couplers can be improved. This makes it possible to prevent malfunctions due to a potential change between the light-emitting elements and the light-receiving elements. Moreover, since the conductor is transparent, there is the advantage of improving transmittance of optical signals from the light-emitting elements to the light-receiving elements.

Furthermore, when the light-blocking resin is filled, the filling direction may be a direction along the longitudinal direction of the second cut groove.

In this case, the light-blocking resin can be filled tightly into the second cut groove and voids occurring after curing of the light-blocking resin can be inhibited, and there is thus the advantage of reliably preventing crosstalk between channels.

An optocoupler produced as described above can be used for, for example, an electronic device such as a power supply device or a communication device, and can contribute to overall downsizing.

The present invention makes it possible to achieve a structure that can adequately inhibit crosstalk between adjacent channels in a simpler manner and at a lower cost compared to conventional examples.

DESCRIPTION OF THE PREFERRED EMBODIMENTS

Hereinafter, an embodiment of a method for manufacturing an optocoupler according to the present invention will be described with reference to FIGS. 1 to 12. The various steps are explained by organizing them under (a) to (f).

Figure 1:
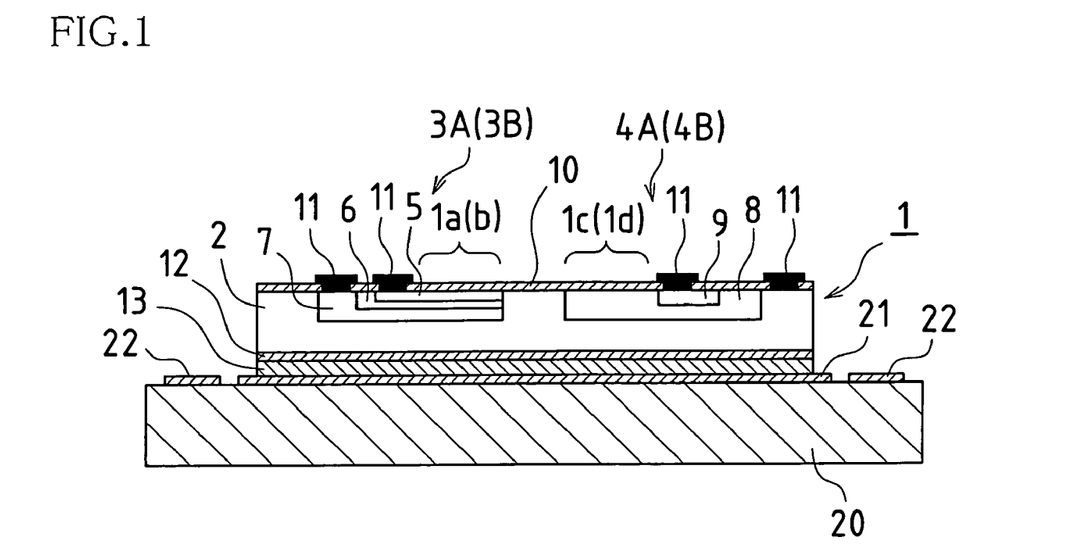
FIG. 1 is a cross-sectional view that illustrates a step of a first stage of an embodiment of a method for manufacturing an optocoupler according to the present invention.
Figure 5:
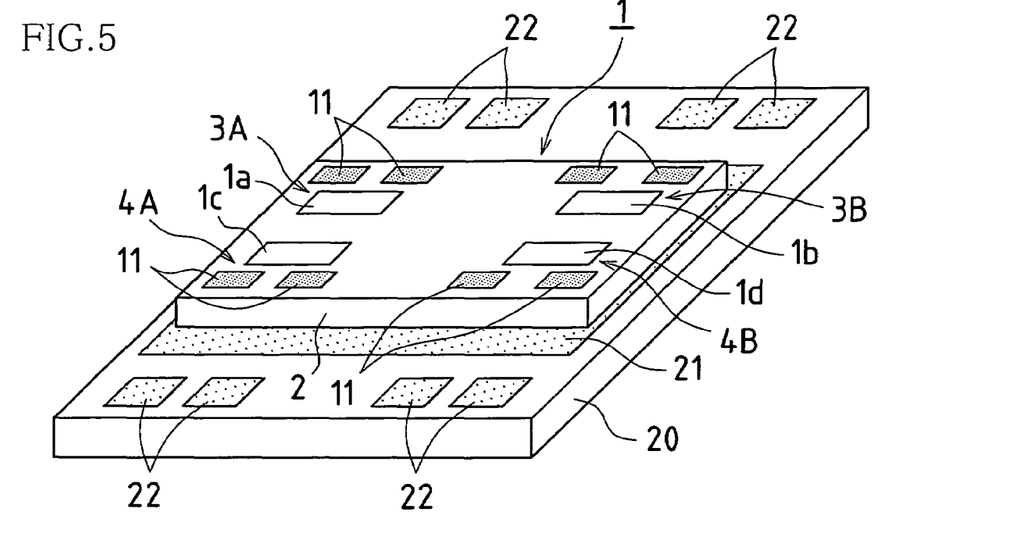
FIG. 5 is a perspective view that illustrates a step that corresponds to FIG. 1.

(a) First, as shown in FIGS. 1 and 5, a multichannel monolithic photo-coupler chip 1 that has been fabricated in a semiconductor process is provided, and the chip 1 is mounted on an insulating substrate 20, which is a glass epoxy substrate or the like (first stage).

More specifically, the chip 1 has a multichannel monolithic structure in which two sets of photo-couplers, in other words, two pairs of light-emitting elements 3A and 3B and light-receiving elements 4A and 4B are provided on a single silicon substrate 2 that is of approximately square shape when viewed from above. Light-emitting surfaces are indicated by the numeric references 1a and 1b, and light-receiving surfaces are indicated by the numeric references 1c and 1d.

The surface of the chip 1 is partitioned into four equal parts, and the two light-emitting elements 3A and 3B and the two light-receiving elements 4A and 4B are each placed in one of the four areas so that the two light-emitting elements 3A and 3B are placed transversely along one side of the chip and the two light-receiving elements 4A and 4B are placed transversely along the side that faces the above-mentioned side of the chip 1.

Each of the light-emitting elements 3A and 3B is a light-emitting diode (LED) of a double hetero structure that has a P layer 5, an active layer 6, and an N layer 7. Each of the light-receiving elements 4A and 4B is a photo-transistor that has a common emitter layer that is made of the silicon substrate 2 itself, a base layer 8, and a collector layer 9.

The front surface side of the silicon substrate 2 is covered with an insulating film 10. Upper surface electrodes 11 are individually connected to each of the P layers 5 and the N layers 7 of the light-emitting elements 3A and 3B as well as to the base layers 8 and the collector layers 9 of the light-receiving elements 4A and 4B, and a ground electrode 12 is connected to the entire surface of the rear side of the silicon substrate 2, in other words, to the emitter layer.

More specifically, the ground electrode 12 of the chip 1 described above is bonded to a conductive pad 21, which is made of a copper foil or the like formed on the insulating substrate 20, using a conductive adhesive 13 so that an ohmic contact is formed.

(b) After this, the light-emitting elements 3A and 3B and the light-receiving elements 4A and 4B, which constitute the two sets of the photo-couplers on the chip 1 on the insulating substrate 20, are insulated and separated.

Figure 2:
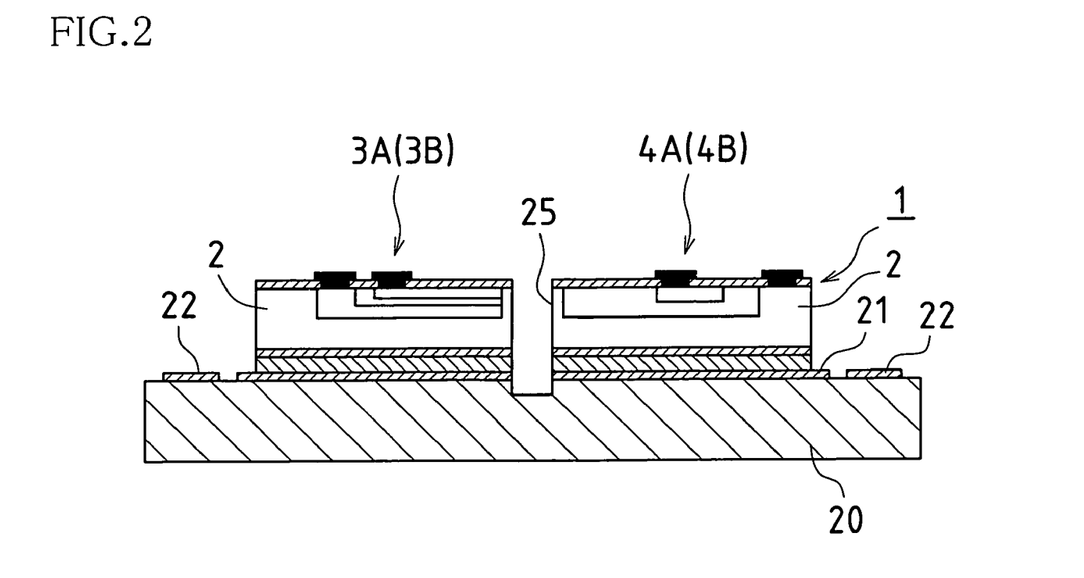
FIG. 2 is a cross-sectional view that illustrates a step of a second stage of an embodiment of a method for manufacturing an optocoupler according to the present invention.
Figure 6:
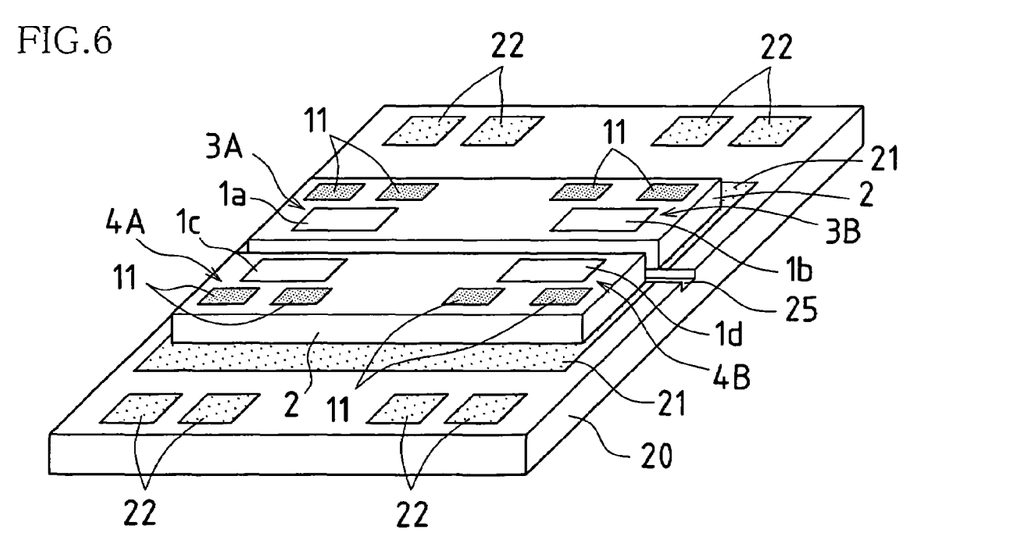
FIG. 6 is a perspective view that illustrates a step that corresponds to FIG. 2.

More specifically, as shown in FIGS. 2 and 6, the light-emitting elements 3A and 3B and the light-receiving elements 4A and 4B are physically separated by dicing a first cut groove 25 between the light-emitting elements 3A and 3B and the light-receiving elements 4A and 4B (second stage).

The depth of the first cut groove 25 is set to a depth that reaches the inside of the insulating substrate 20.

Figure 3:
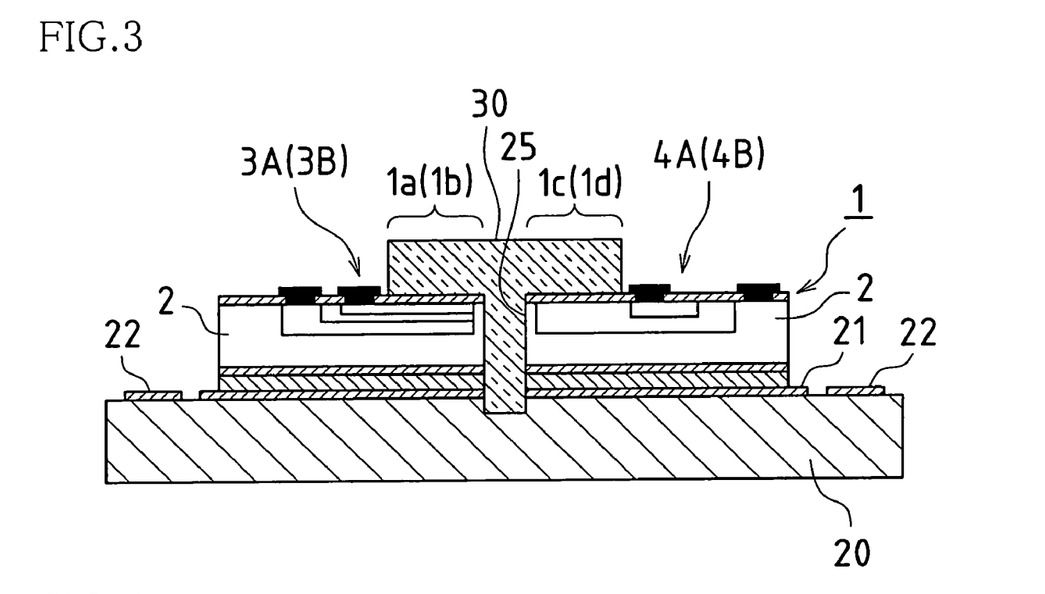
FIG. 3 is a cross-sectional view that illustrates a step of a third stage of an embodiment of a method for manufacturing an optocoupler according to the present invention.
Figure 4:
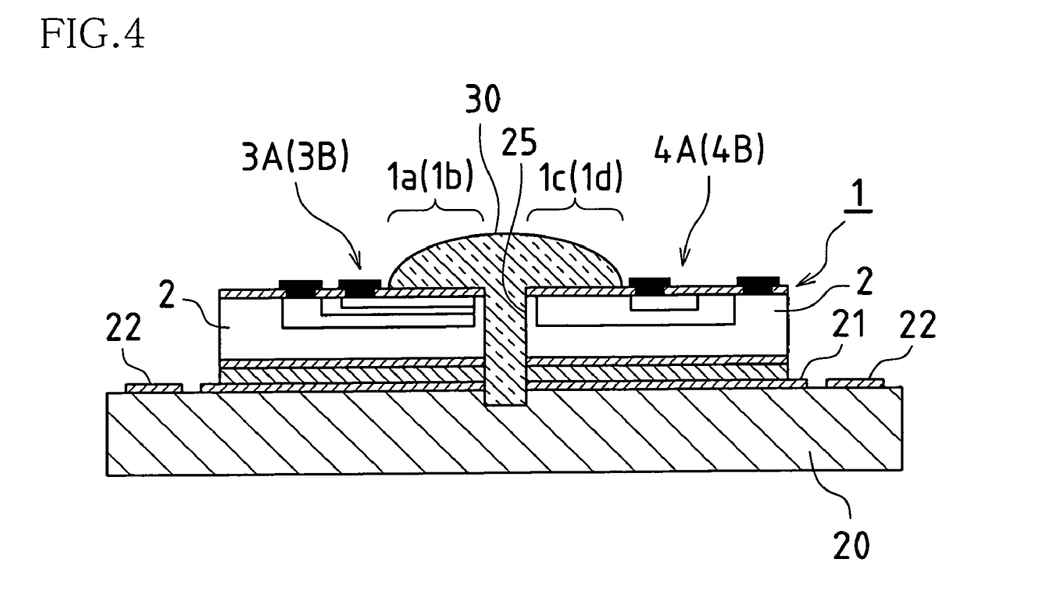
FIG. 4 is a cross-sectional view of another example of the step shown in FIG. 3.

(c) As shown in FIGS. 3 or 4, a transparent insulating resin 30 that forms an optical waveguide is filled into the first cut groove 25 (third stage). The transparent insulating resin 30 is provided so as to rise outward from the opening of the first cut groove 25 so that the light-emitting surfaces 1a and 1b of the light-emitting elements 3A and 3B as well as the light-receiving surfaces 1c and 1d of the light-receiving elements 4A and 4B are covered.

FIG. 3 shows an example in which the transparent insulating resin 30 is transfer molded. In this case, the portion of the transparent insulating resin 30 that rises from the first cut groove 25 takes on an angular shape.

FIG. 4 shows an example in which a liquid transparent silicon resin or the like is applied as the transparent insulating resin 30 to the first cut groove 25 and heat cured. In this case, the portion of the transparent insulating resin 30 that rises from the first cut groove 25 takes on a round shape.

(d) Next, the two adjacent sets of photo-couplers (channels) on the chip 1 on the insulating substrate 20 are separated.

Figure 7:
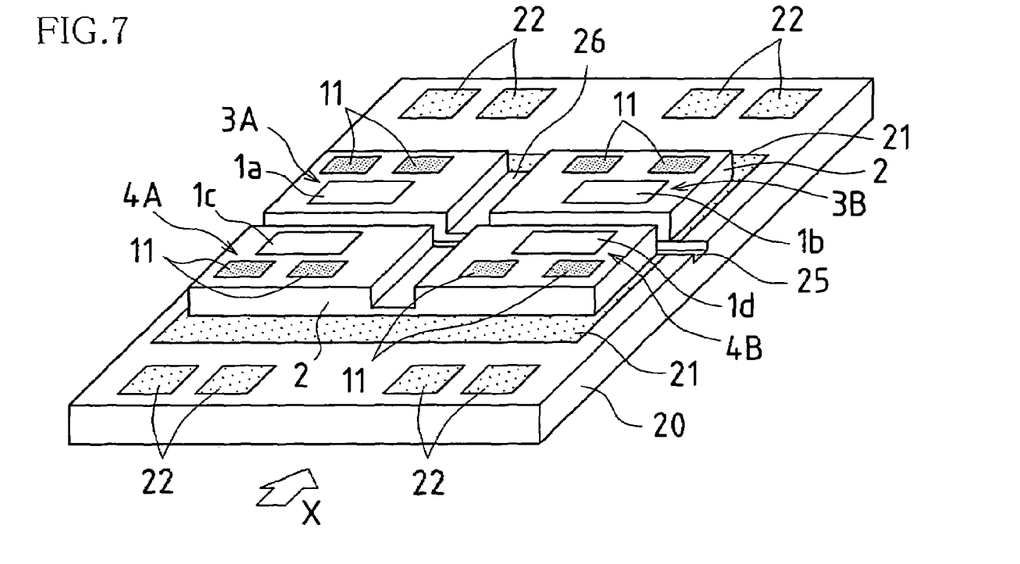
FIG. 7 is a perspective view that illustrates a step of a fourth stage of an embodiment of a method for manufacturing an optocoupler according to the present invention.
Figure 8:
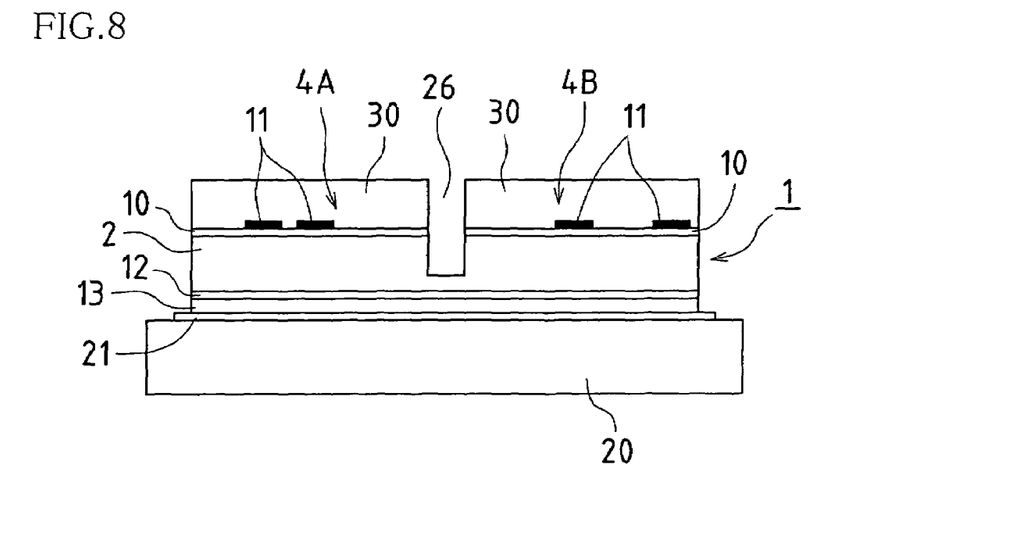
FIG. 8 is a side view of FIG. 7 as viewed from the direction of X indicated by the arrow.

More specifically, as shown in FIGS. 7 and 8, the two adjacent sets of photo-couplers are physically separated by dicing a second cut groove 26 between the two adjacent sets of photo-couplers, in other words, the first pair that includes the light-emitting element 3A and the light-receiving element 4A, and the second pair that includes the light-emitting element 3B and the light-receiving element 4B (fourth stage).

The second cut groove 26 is provided so that it crosses the first cut groove at right angles. In addition, the depth of the second cut groove 26 is set to a depth that does not reach the bottom surface of the silicon substrate 2 of the chip 1 so that the insulating substrate 20 stays out of reach. This enables adjacent channels to share the potential in the emitter layer as well as in the ground electrode 12. Accordingly, the number of external terminals can be reduced, and thus the size of the package can be reduced. In addition, since the potential can be shared by forming the second cut groove 26 as described above, internal connection by wire bonding inside of the package, which has been done for sharing of the potential, becomes unnecessary.

Figure 9:
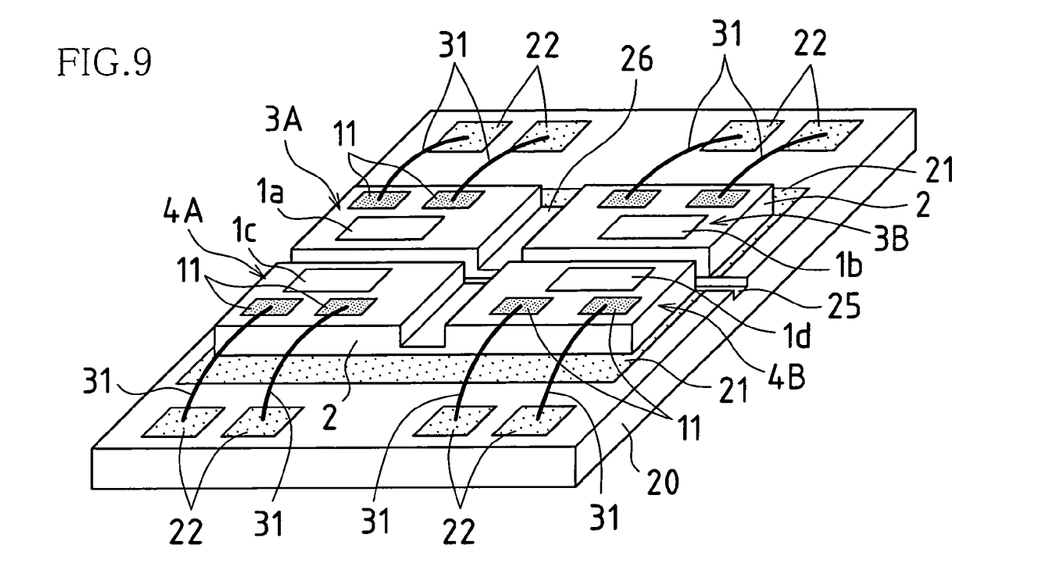
FIG. 9 is a perspective view that illustrates a step of a fifth stage of an embodiment of a method for manufacturing an optocoupler according to the present invention.

(e) After this, as shown in FIG. 9, each of the upper surface electrodes 11 of the light-emitting elements 3A and 3B and of the light-receiving elements 4A and 4B is electrically connected to a corresponding external terminal pad 22 made of a copper foil or the like that has been provided on the insulating substrate 20, using a bonding wire 31 (fifth stage).

Figure 10:
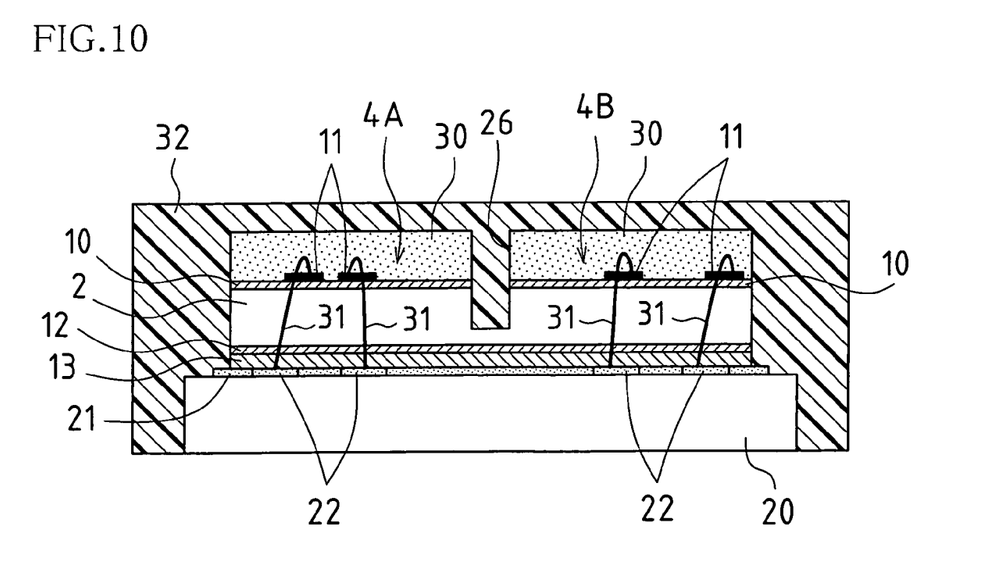
FIG. 10 is a diagram that illustrates a step of a sixth stage of an embodiment of a method for manufacturing an optocoupler according to the present invention.

(f) As shown in FIG. 10, a light-blocking resin 32 is molded to cover and encompass the entirety of the thus configured assembly (sixth stage). At this time, since the light-blocking resin 32 is filled into the second cut groove 26, crosstalk between channels can be prevented.

More specifically, the light-blocking resin 32 may be filled by, for example, transfer molding.

Figure 11:
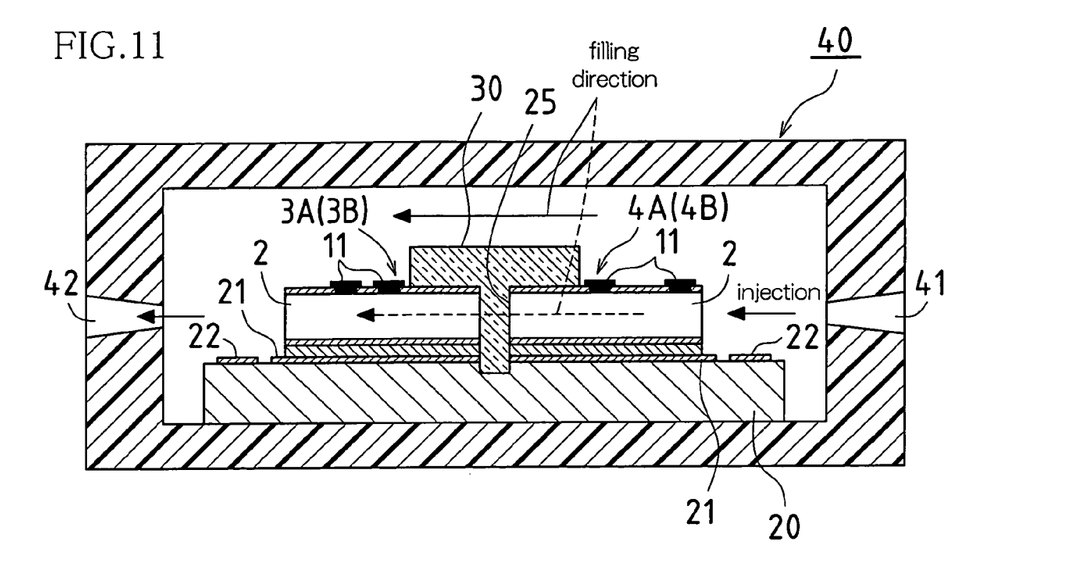
FIG. 11 is a diagram of an example of a method for forming a light-blocking resin shown in FIG. 10.

For example, the assembly shown in FIG. 10 may be stored within a transfer mold 40 as shown in FIG. 11. At this time, since the molten resin flows from a gate portion 41 to an air vent portion 42 within the transfer mold 40, the longitudinal direction of the second cut groove 26 of the assembly is placed along the direction of the flow.

As a result of this, the light-blocking resin 32 can be filled tightly into the second cut groove 26 and voids occurring after the curing of the light-blocking resin 32 can be inhibited, so that there is the advantage of reliably preventing crosstalk between channels.

Figure 12:
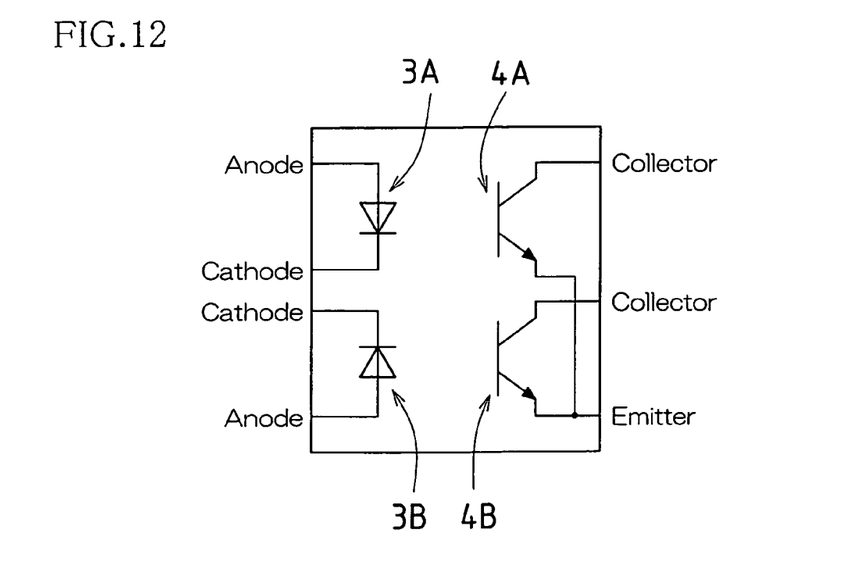
FIG. 12 is an equivalent circuit diagram of the structure shown in FIG. 9.

An optocoupler can be achieved as described above, and in this case, the equivalent circuit becomes as shown in FIG. 12.

As explained above, the first cut groove 25, which insulates and separates the pair of the light-emitting elements 3A and 3B from the pair of the light-receiving elements 4A and 4B, as well as the second cut groove 26, which prevents crosstalk between adjacent channels, are formed by a mechanical process such as dicing.

This reduces the number of the steps and eliminates the need for micromachining compared to when photo-lithography or etching as used in the conventional example is used. For this reason, the operations becomes simple and the operating efficiency improves, and it is thus possible to drastically reduce the production cost. Accordingly, a reasonably-priced optocoupler that has a reliable structure can be provided.

Hereinafter, another embodiment of the present invention will be described.

Figure 13:
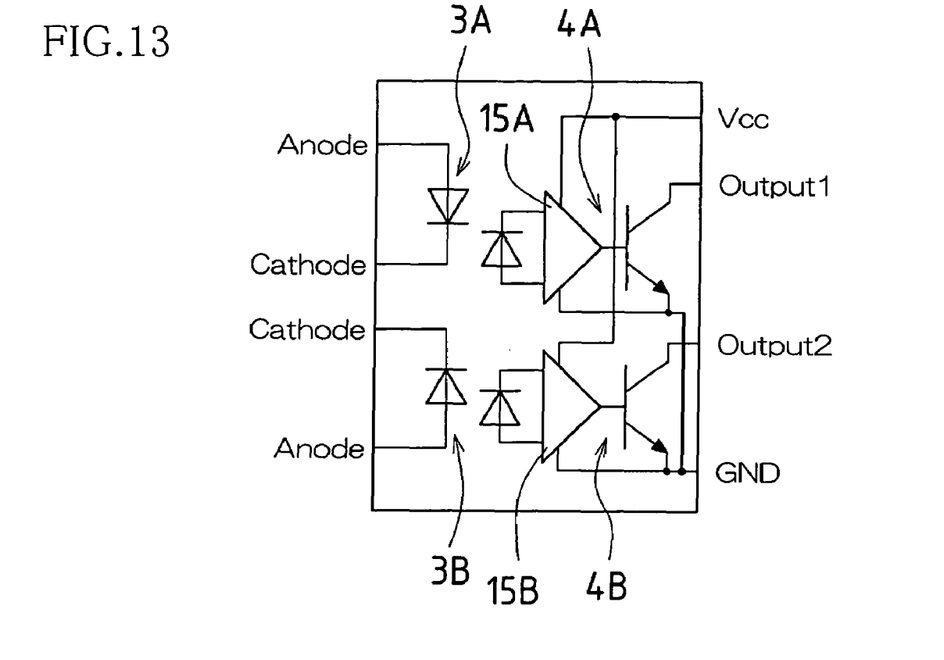
FIG. 13 is an equivalent circuit diagram of another example of FIG. 12.

(1) As shown in the equivalent circuit in FIG. 13, amplifiers 15A and 15B may be connected to photo-transistors used as the light-receiving elements 4A and 4B.

Figure 14:
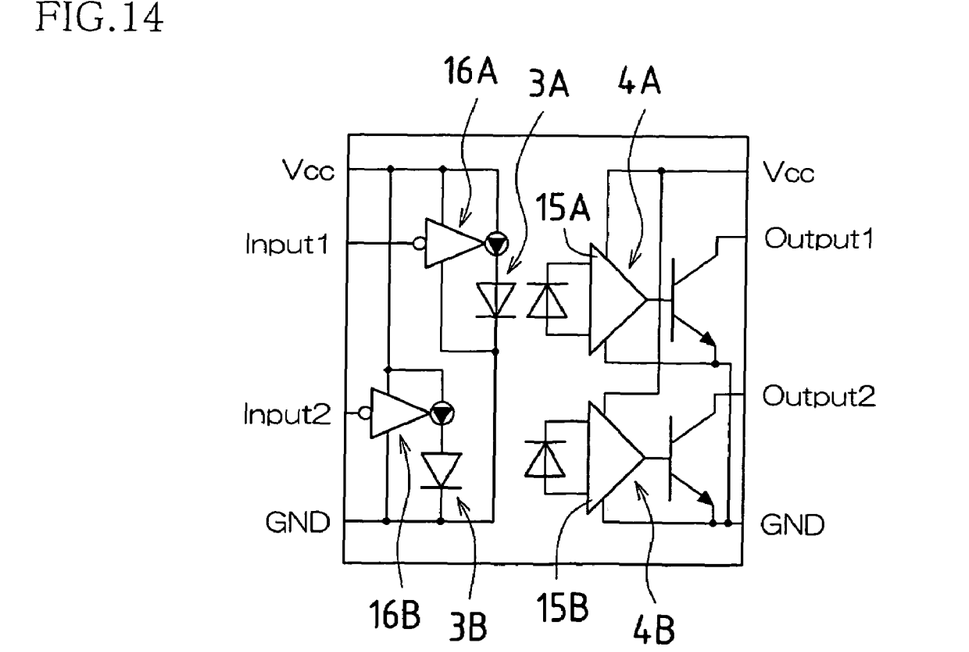
FIG. 14 is an equivalent circuit diagram of another example of FIG. 12.

In addition, as shown in the equivalent circuit shown in FIG. 14, drive circuits 16A and 16B may be formed near the light-emitting elements 3A and 3B on the chip 1. In this case, the ground potential can be shared between the light-emitting elements 3A and 3B. The drive circuits may each be an IC chip separate from the chip 1 and can be mounted on the insulating substrate 20.

This configuration has the advantage of reducing the outer dimensions of an optocoupler 10.

Figure 15:
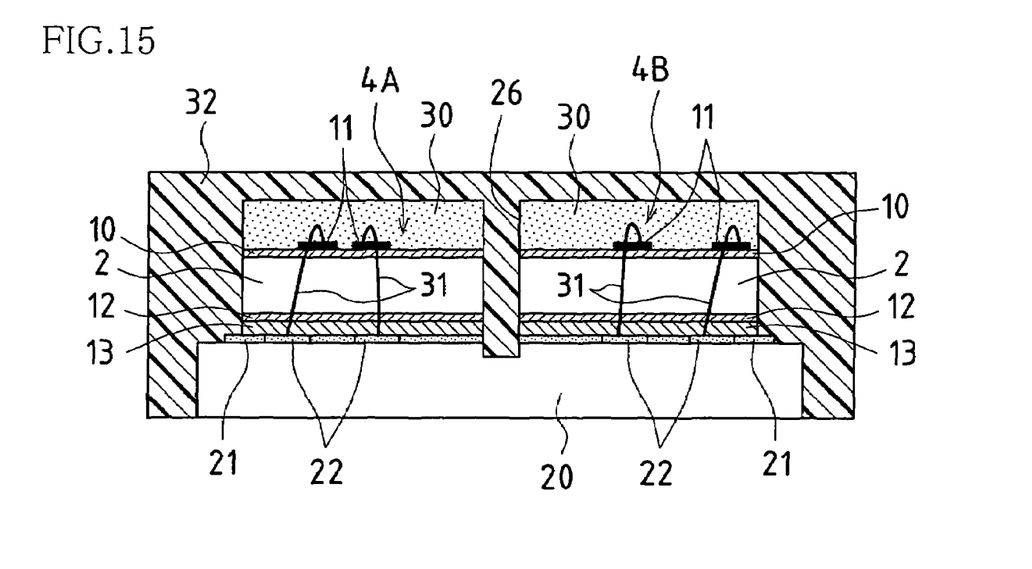
FIG. 15 is a diagram of another example of FIG. 10.

(2) The depth of the second cut groove 26 may, for example as shown in FIG. 15, be set deep enough to reach the inside of the insulating substrate 20.

In this case, crosstalk between adjacent channels can be inhibited more effectively. In addition, when sharing of the emitter potential among channels is not necessary, channels can be electrically blocked from each other.

Figure 16:
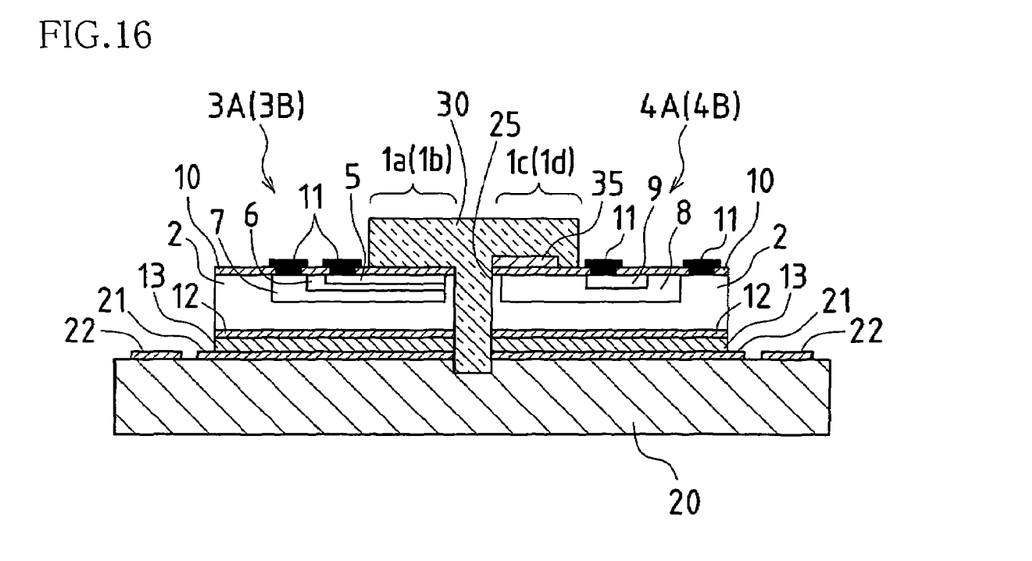
FIG. 16 is a cross-sectional view of another example of FIG. 2.

(3) As shown in FIG. 16, a wire 35 that is connected to a common ground or a common emitter layer may be provided on the base layer 8 of the light-receiving elements 4A and 4B on the chip 1. In this case, since the electric charge that is generated by a sudden potential change between the light-emitting elements 3A and 3B and the light-receiving element 4A and 4B can escape to the outside without going through the base layer 8 of the light-receiving elements 4A and 4B, a superior noise tolerance can be achieved, in other words, the CMR property of the photo-couplers can be improved.

Figure 17:
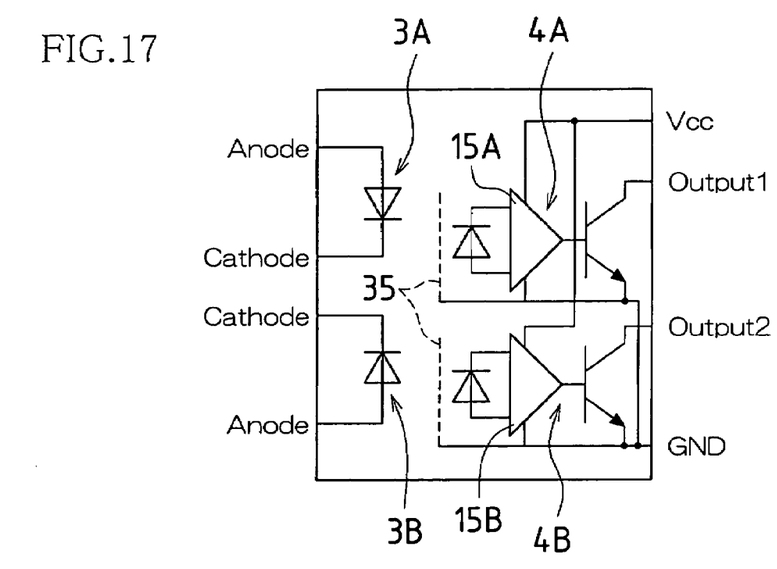
FIG. 17 is an equivalent circuit diagram of the structure shown in FIG. 16.

At this point, as shown in FIGS. 3 and 4 for example, if the transparent insulating resin 30 is raised outside of the first cut groove 25, the use of a transparent conductive material, preferably ITO, ZnO, $In_2O_3$—ZnO or the like, as the material of the wire 35 has the advantage of improving transmittance of optical signals from the light-emitting elements 3A and 3B to the light-receiving elements 4A and 4B. An equivalent circuit of this configuration is shown in FIG. 17. The wire 35 is indicated by broken lines.

Figure 18:
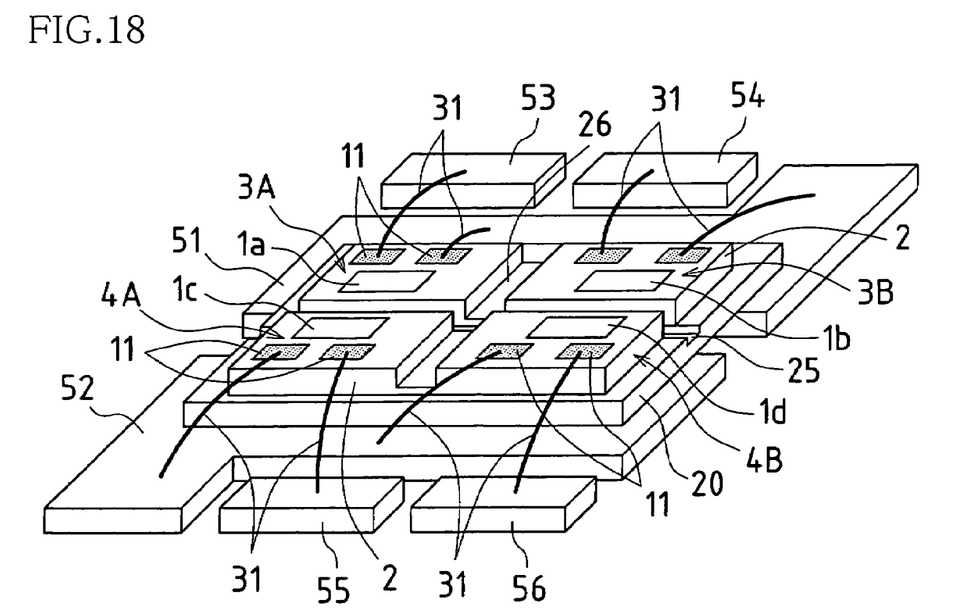
FIG. 18 is a perspective view that illustrates a step that corresponds to FIG. 9 in another embodiment of a method for manufacturing an optocoupler according to the present invention.

(4) As shown in FIG. 18, the following structure is possible: a glass substrate is used as the insulating substrate 20, the chip 1 is mounted on the insulating substrate 20 and formed as in the above-described embodiment, the insulating substrate 20 is then mounted so as to span lead frames 51 and 52, and the upper surface electrodes 11 of each of the light-emitting elements 3A and 3B and of the light-receiving elements 4A and 4B are each connected to lead frames 53, 54, 55, and 56 with bonding wires 31. In this case, the ground electrode 12 is not provided on the back surface of the chip 1, and one of the plurality of the upper surface electrodes 11 is used as a ground electrode and the ground electrode is connected to the lead frame 51 using the bonding wire 31.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

What is claimed is:

1. A method for manufacturing an optocoupler having a plurality of photo-couplers each of which comprises a pair of a light-emitting element and a light-receiving element, the method comprising:
 a step of mounting a multichannel monolithic chip, which has a plurality of the photo-couplers formed on a single semiconductor substrate, on an insulating substrate,
 a step of insulating and separating the light-emitting elements and the light-receiving elements by dicing a first cut groove between the light-emitting elements and the light-receiving elements, which constitute the photo-couplers in the chip on the insulating substrate,
 a step of filling a transparent insulating resin into the first cut groove,
 a step of dividing the individual photo-couplers by dicing a second cut groove between the adjacent photo-couplers, and
 a step of connecting each of the light-emitting elements and each of the light-receiving elements to an external terminal using a bonding wire and molding the entirety of the insulating substrate with a light-blocking resin.

2. The method for manufacturing an optocoupler according to claim 1, wherein a depth of the second cut groove is set to a depth that does not reach a bottom surface of the chip.

3. The method for manufacturing an optocoupler according to claim 1, wherein a depth of the second cut groove is set to a depth that reaches into the insulating substrate.

4. The method for manufacturing an optocoupler according to claim 1, wherein a conductor comprising a transparent conductive material that has been grounded is provided on a light-receiving surface of the light-receiving element.

5. The method for manufacturing an optocoupler according to claim 2, wherein a conductor comprising a transparent conductive material that has been grounded is provided on a light-receiving surface of the light-receiving element.

6. The method for manufacturing an optocoupler according to claim 3, wherein a conductor comprising a transparent conductive material that has been grounded is provided on a light-receiving surface of the light-receiving element.

7. The method for manufacturing an optocoupler according to claim 1, wherein when the light-blocking resin is filled, a filling direction is a direction along a longitudinal direction of the second cut groove.

8. The method for manufacturing an optocoupler according to claim 2, wherein when the light-blocking resin is filled, a filling direction is a direction along a longitudinal direction of the second cut groove.

9. The method for manufacturing an optocoupler according to claim 3, wherein when the light-blocking resin is filled, a filling direction is a direction along a longitudinal direction of the second cut groove.

10. The method for manufacturing an optocoupler according to claim 4, wherein when the light-blocking resin is filled, a filling direction is a direction along a longitudinal direction of the second cut groove.

11. The method for manufacturing an optocoupler according to claim 5, wherein when the light-blocking resin is filled, a filling direction is a direction along a longitudinal direction of the second cut groove.

12. The method for manufacturing an optocoupler according to claim 6, wherein when the light-blocking resin is filled, a filling direction is a direction along a longitudinal direction of the second cut groove.

* * * * *